(12) United States Patent
Ide

(10) Patent No.: US 6,781,632 B1
(45) Date of Patent: Aug. 24, 2004

(54) IMAGE PICK-UP APPARATUS CAPABLE OF FOCUS DETECTION

(75) Inventor: Masataka Ide, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 09/551,821

(22) Filed: Apr. 18, 2000

(30) Foreign Application Priority Data

Apr. 20, 1999 (JP) .......................................... 11-112189

(51) Int. Cl.⁷ ............................................ G03B 13/00
(52) U.S. Cl. ..................... 348/345; 396/89; 250/201.2; 250/201.4
(58) Field of Search ................................ 348/345, 273, 348/336; 396/101, 102, 104, 113, 114, 98, 89, 93, 133, 125; 359/619; 250/201.2, 201.4, 201.6, 201.7, 201.8

(56) References Cited

U.S. PATENT DOCUMENTS

| | | | | |
|---|---|---|---|---|
| 4,185,191 A | | 1/1980 | Stauffer ....................... 250/204 |
| 5,530,514 A | * | 6/1996 | Lisson et al. ................ 396/114 |
| 5,757,423 A | * | 5/1998 | Tanaka et al. ............ 348/218.1 |
| 5,864,721 A | * | 1/1999 | Suda et al. .................. 396/114 |
| 6,473,126 B1 | * | 10/2002 | Higashihara et al. ........ 348/345 |
| 2001/0045989 A1 | * | 11/2001 | Onuki ......................... 348/345 |

FOREIGN PATENT DOCUMENTS

| JP | 10-197783 | 7/1998 |
|---|---|---|
| JP | 10-213737 | 8/1998 |
| JP | 10-274562 | 10/1998 |

* cited by examiner

*Primary Examiner*—Vu Le
*Assistant Examiner*—Kelly L. Jerabek
(74) *Attorney, Agent, or Firm*—Straub & Pokotylo; John C. Pokotylo

(57) ABSTRACT

The present invention relates to an image pick-up apparatus having a focus detection mechanism capable of improving an AF speed at low costs and in a space-saving way without adding any new mechanism or optical system and ensuring an accurate focus adjustment and capable of preventing a picture-taking image quality being deteriorated. An image pick-up device of the image pick-up apparatus of the present invention has a focus detection area and image pick-up area and, since no image data is obtained at the focus detection area, interpolation processing is done with image data of a peripheral image pick-up area. In the case where a color filter is provided in the image pick-up area, interpolation processing is done with image data of an image pick-up area and image data of a peripheral area.

20 Claims, 12 Drawing Sheets

| G | B3 | G | B1 | G | B6 | G |
|---|---|---|---|---|---|---|
| R | G1 | R | G4 | R | G | R |
| G | B | Ga | Ba | Gb | Bb | Gc |
| R | G2 | R | G3 | R | G | R |
| G | B4 | G | B2 | G | B5 | G |

| G | B3 | G | B1 | G | B6 | G |
|---|---|---|---|---|---|---|
| R | G1 | R | G4 | R | G | R |
| G | B | A1 | A2 | A3 | A4 | A5 |
| R | G2 | R | G3 | R | G | R |
| G | B4 | G | B2 | G | B5 | G |

FIG. 15

| G | B | G | B | G | B | G | B |
|---|---|---|---|---|---|---|---|
| R | G1 | R | G4 | R | G | R | G |
| G | B | A1 | B(A2) | A3 | B(A4) | A5 | B(A6) |
| R | G2 | R | G3 | R | G | R | G |
| G | B | G | B | G | B | G | B |

FIG. 18A

| B | G | B1 | G | B | G | B | G |
|---|---|---|---|---|---|---|---|
| G | R | G | R | G | R | G | R |
| B | G | A1 | G(A2) | A3 | G(A4) | A5 | G(A6) |
| G | R | G | R | G | R | G | R |
| B | G | B2 | G | B | G | B | G |

FIG. 18B

IMAGE PICK-UP APPARATUS CAPABLE OF FOCUS DETECTION

CROSS-REFERENCE TO RELATED APPLICATIONS

This application is based upon and claims the benefit of priority from the prior Japanese Patent Application No. 11-112189, filed Apr. 20, 1999, the entire contents of which are incorporated herein by reference.

BACKGROUND OF THE INVENTION

The present invention relates to an image pick-up apparatus having a focus adjusting function and adapted to pick-up an image with the use of an electronic image pick-up device.

Conventionally, various techniques are disclosed on the image pick-up apparatus for electronically picking up a subject image with the use of an electronic image pick-up device.

For example, JPN PAT APPLN KOKAI PUBLICATION No. 10-213737 discloses the technique relating to an image pick-up apparatus adopting the so-called "hill climbing system" as an auto-focus (hereinafter referred to as an AF) system. The hill climbing system is comprised of a system for seeking an image-taking lens position where the contrast of a subject image taken by an image pick-up device is made maximal.

JPN PAT APPLN KOKAI PUBLICATION No. 10-197783 discloses the technique relating to an image pick-up apparatus adopting a TTL phase difference detection system. In this TTL phase difference detection system, subject light is pupil-divided in a time sharing fashion through the driving of a diaphragm member and pupil-divided light beams are received by an image pick-up device to detect the corresponding phase difference.

U.S. Pat. No. 4,185,191, on the other hand, discloses the technique relating to a TTL phase difference detection apparatus. This is called as a fly lens system in which a light beam passing through a lens array is received by a pair of light receiving elements constituting a line sensor and, through the processing of the line sensor's signals, an image shift amount, that is, a phase difference amount is calculated and, focus adjustment is made by the feeding it back to a focusing lens.

Further, JPN PAT APPLN KOKAI PUBLICATION No. 10-274562 discloses the technique relating to a TTL phase difference detection apparatus adopting a re-imaging system.

In the hill climbing system, however, an image-taking lens is moved to seek a contrast peak of a subject image of the image pick-up device, thus presenting a problem of a slow AF speed.

In the technique shown in the JPN PAT APPLN KOKAI PUBLICATION No. 10-197783, the diaphragm member is driven through a mechanical mechanism to provide pupil division, and the drive mechanism and mounting space are required, thus making it difficult to provide a compact device. Further, these occur a time difference in the formation of a plurality of pupils divided and, in addition, detection precision is largely lowered for a moving subject, and it takes a time to move the mechanical diaphragm member. As a result, the AF speed becomes slower, thus presenting a problem.

In the focus detection apparatus disclosed in the U.S. Pat. No. 4,185,191, a portion of subject light passing through the image-taking lens is guided in a divided fashion and it suffers an optical restriction and a space restriction problem.

For the focus detection apparatus disclosed in above-mentioned JPN PAT APPLN KOKAI PUBLICATION No. 10-274562 it is necessary to provide a re-imaging optical system and, in addition to an optical path division problem, a space restriction problem is also produced.

As a method for solving the above-mentioned problem, the following method may be considered.

That is, a microlens group for allowing light which passes through the image-taking lens to be pupil-divided and a pair of light receiving element groups for receiving the pupil-divided light beams are partially formed on the image pick-up device to provide a focus detection area where focus detection is done with the use of a phase difference detection system.

When, however, this method is adopted, the pixel signals of the focus detection area cannot be used as image data and, with respect to a pick-up image, an image quality of the focus detection area is lowered.

BRIEF SUMMARY OF THE INVENTION

The present invention is achieved with the above-mentioned problems in view and the object of the present invention is to provide an image pick-up apparatus having a focus detection function which can improve an AF speed at low costs and in a space-saving fashion without adding any new mechanism and optical system and ensure an accurate focus adjustment and can prevent an imaging quality from being deteriorated.

In order to achieve the above-mentioned object of the present invention there is provided an image pick-up apparatus having an image pick-up device for electronically picking up an image, which comprises a first light receiving element group having a plurality of first light receiving elements to allow the subject light which passes through the picture-taking lens to be received, a microlens group for allowing the subject light which passes through the picture-taking lens to be pupil-divided into light beams, a second light receiving element group having a plurality of second light receiving elements each comprising a pair of light receiving portions which receive the light beams of the subject light, focus detection means for effecting focus detection based on outputs of the second light receiving element group, correction means for correcting a subject image corresponding to a focus detection area present at the second light receiving element group on the basis of the output of the first light receiving element group, and image pick-up means for picking up an image based on signals output from the first receiving element group and signals output from the correction means.

In a second embodiment there is provided an image pick-up apparatus having an image pickup device for electronically picking up a subject image passing through a picture-taking lens, comprising a first light receiving element group having a plurality of first light receiving elements for allowing the subject image to be received, a microlens group for allowing the subject light which passes through the picture-taking lens to be pupil-divided into light beams, a second light receiving element group having a plurality of second light receiving elements each comprised of a pair of light receiving portions which receive the light beams of the subject light, a focus detection section for effecting focus detection of the image apparatus based on the output of the second light receiving element group, a correction section for correcting an image of the focus detection area present in the second light receiving element group on the basis of the output of the first light receiving element group, and an image pick-up section for picking up an image based on signals output from the first light receiving element group and signals output from the correction section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a view for explaining, in detail, an image data interpolation method;

FIG. 14 is a view showing a focus detection area array in an image pick-up apparatus according to a second embodiment;

FIG. 15 is a view showing a focus detection area array in the second embodiment;

FIG. 18A is a view showing an array of the focus detection area in an image pick-up apparatus according to the fourth embodiment; and FIG. 18B is a view showing a variant of the array of FIG. 18A.

DETAILED DESCRIPTION OF THE INVENTION

The embodiments of the present invention will be explained below with reference to the accompanying drawing.

Figure 1:
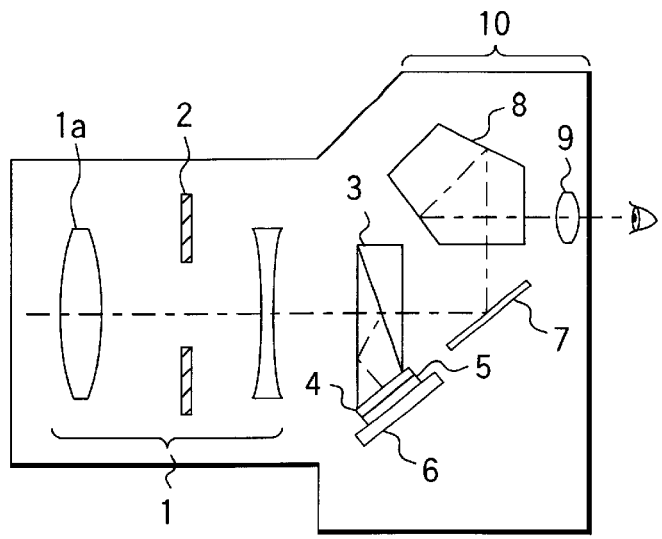
FIG. 1 is a schematic view showing an optical system in an image pick-up apparatus according to a first embodiment of the present invention.

FIG. 1 is a view showing an arrangement of an optical system of an image pick-up apparatus according to a first embodiment of the present invention.

As shown in FIG. 1, a focusing lens 1a is arranged in a predetermined position to allow the incidence of subject light and a diaphragm 2 is arranged on its optical axis. The focusing lens 1a, diaphragm 2, etc., constitute an image-taking optical system 1. A beam splitter 3 is arranged on the optical path of the subject light through the above-mentioned image-taking optical system. On an optical path of the light reflected on the beam splitter, an infrared cut filter 4, low-pass filter (herein below referred as an LPF) 5 and image pick-up device 6 are arranged.

On an optical path of the light passed through the beam splitter, on the other hand, a mirror 7, pentagonal prism 8 and eyepiece lens 9 are arranged to provide a finder optical system 10.

Incidentally, the diaphragm 2 can retain a predetermined diaphragm opening and has a shutter function to completely shut the light.

In such a construction, a portion of the subject light passed through the image-taking optical system 1 is downwardly reflected on the beam splitter 3, followed by the elimination of its infrared component on the infrared cut filter 4 and reduction of a moire on the LPF5. By doing so, it is imaged by the image pick-up device 6. That portion of the subject light passed through the beam splitter 3, after being reflected on the mirror 7, etc., leads to the finder optical system 10 comprising the pentagonal prism 8, eyepiece lens 9, etc., and is observed by the observer.

Figure 2:
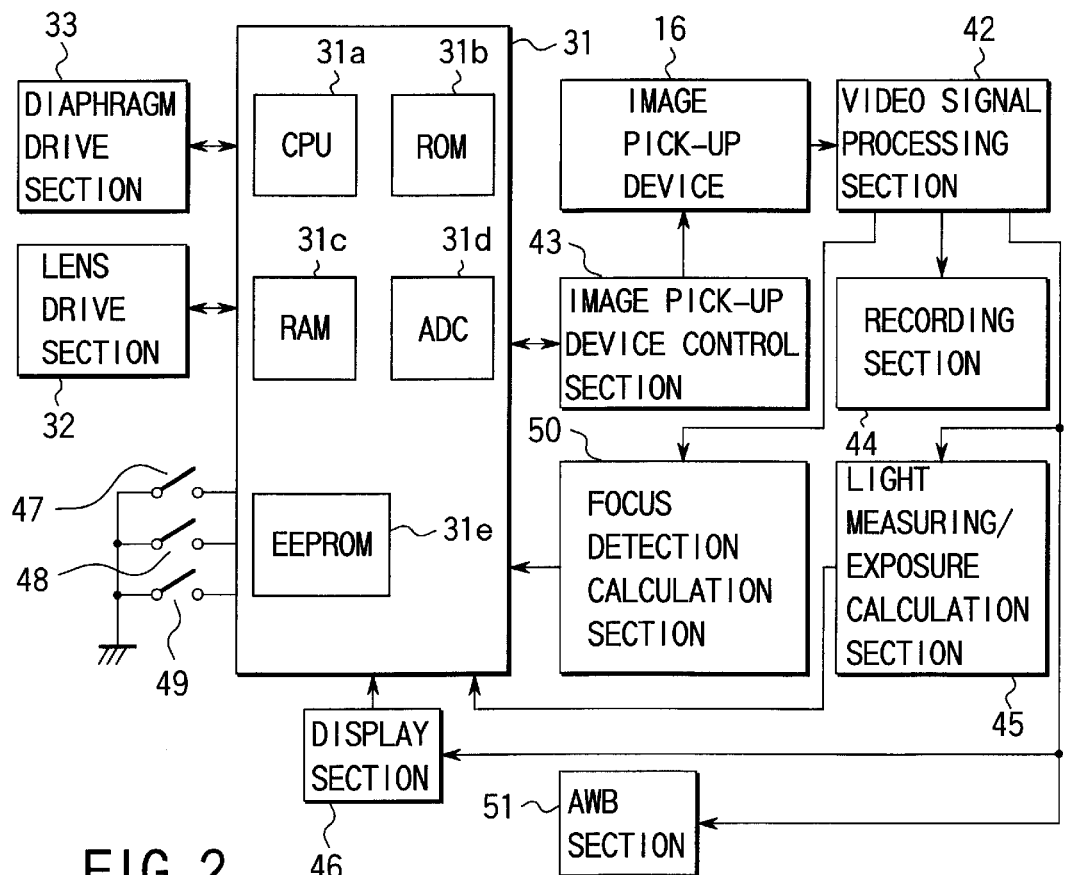
FIG. 2 is a schematic view showing an electric system of the image pick-up apparatus according to the first embodiment.

FIG. 2 is a schematic view showing an electric system of the image pick-up device according to the first embodiment.

As shown in FIG. 2, a microcomputer 31 at least has a central processing unit (hereinafter referred to as a CPU) 31a controlling the whole apparatus, read only memory (hereinafter referred to as a ROM) 31b, random access memory (hereinafter referred to as a RAM) 31c, analog/digital converter (hereinafter referred to as an ADC) 31d and EEPROM 31e comprised of a nonvolatile memory.

Further, the microcomputer 31 is electrically connected to a lens drive section 32, diaphragm drive section 33, image pick-up device control section 43, display section 46, first release switch (hereinafter referred to as a 1RSW) 47, secondary release switch (hereinafter referred to as a 2RSW) 48, and area select switch 49.

Further, the output of the image pick-up device control section 43 is connected to the input of an image pick-up device 16 (same as the image pick-up element 6 in FIG. 1) and the output of the image pick-up element 16 is connected to the input of a video signal processing section 42. The output of the video signal processing section 42 is connected to the inputs of a recording section 44, light measuring/exposure calculation section 45, display section 46, focus detection calculation section 50 and auto white balance (hereinafter referred to as an AWB) section 51.

The output of the light measuring/exposure calculation section 45 and output of the focus detection calculation section 50 are connected to the inputs of the microcomputer 31.

In such an arrangement, the microcomputer 31 performs a series of operation in accordance with a sequence program stored in its internal ROM 31b. The EEPROM 31e in the microcomputer 31 stores, for each camera, correction data on the focus adjustment, light measurement/exposure calculation, AWB, etc. The image pick-up device 16 takes, as an image, the subject image formed by the image-taking optical system 1 and converts it to an electric signal.

The video signal processing section 42 performs processing on an electric signal which is a pixel signal from the image pick-up device 16 and prepares a video signal. The detailed structure will be set out below.

The light measuring/exposure calculation section 45 calculates a light measurement value, exposure control value on the basis of the video signal processed at the video signal processing section 42. Further, the image pick-up device control section 43 controls an electronic shutter of the image pick-up device 16 at a time of taking an image on the basis of a shutter speed as an output of the light measuring/exposure calculation section 45. In this embodiment, the control of the diaphragm 2 in the image-taking optical system 1 at the time of taking the image is carried out on the basis of diaphragm value data calculated by the exposure calculation of the light measuring/exposure calculation section 45.

The diaphragm drive section 33 drives the diaphragm 2 on the basis of a command from the microcomputer 31. Further, the focus calculation section 50 performs a focus detection calculation on the basis of a video signal processed by the video signal processing section 42. As a result of the focus detection calculation, just-in-focus decision data, focusing lens drive amount, etc., are transmitted to the microcomputer 31.

The AWB section 51 automatically controls the white balance on the basis of the video signal in the video signal processing section 42. Under the control of the microcomputer 31, the display section 46 displays a video taken by the image pick-up device 16 and information in the camera on a liquid crystal display device (LCD: Liquid Crystal Display), etc.

1RSW 47 and 2RSW 48 are connected in interlock with the release button and are such that the 1RSW 47 is turned ON with the depression of the release button at its first depression step and the 2RSW 48 is turned ON with a subsequent depression of the release button at its second depression step. The area select SW 49 is of such a type as to select the AF area and to be selectively moved at the predetermined AF area at each turned-ON time. The microcomputer 31 performs the light measuring/AF operation with the 1RSW 47 ON and performs an exposure operation and image recording operation with the 2RSW 48 ON.

Further, the lens drive section 32 drives the focusing lens 1a on the basis of the command from the microcomputer 31.

Figure 3:
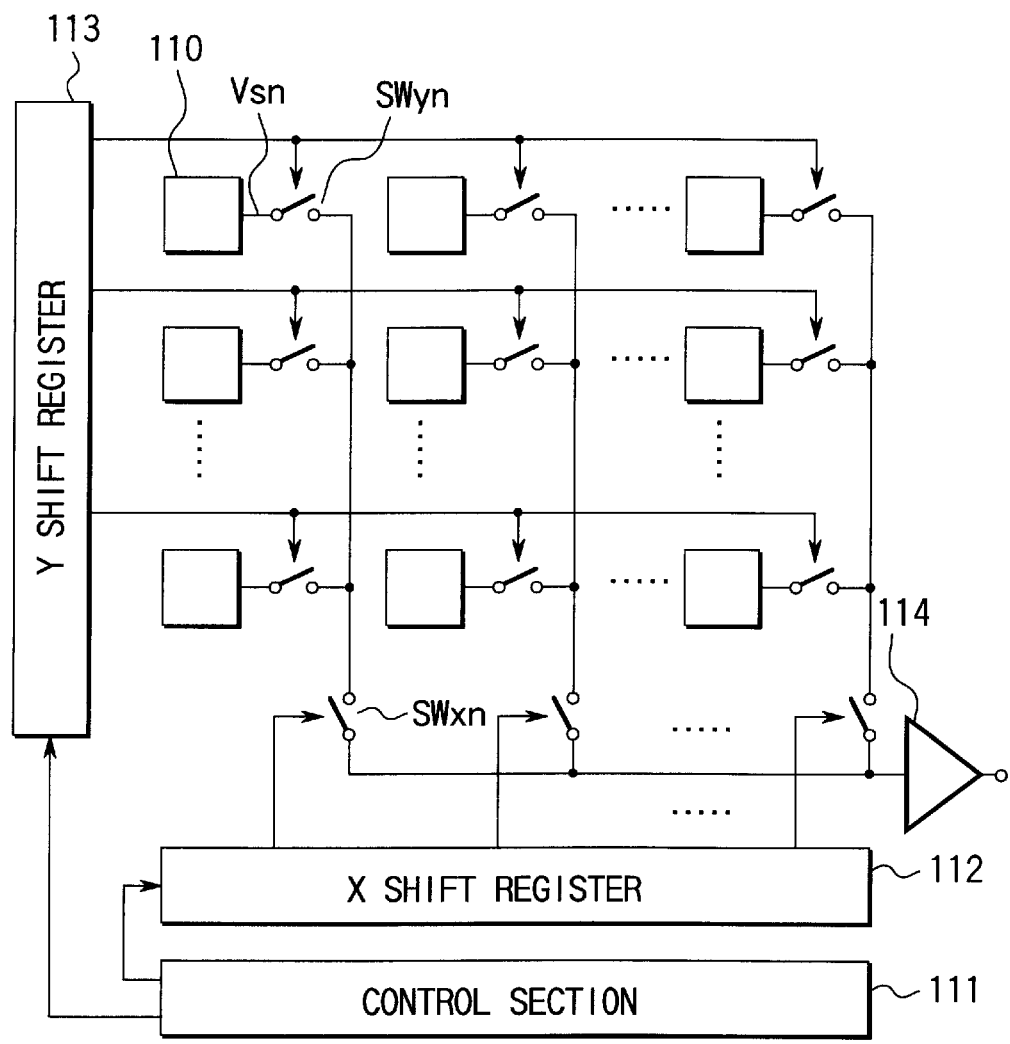
FIG. 3 is a view showing a detail of an image pick-up device 6.

Here, FIG. 3 is a view showing a detailed arrangement of the image pick-up device.

As shown in FIG. 3, the image pick-up device 6 as a MOS type sensor is so configured as to have a two-dimensional array of pixel units 110 including a photodiode as a light-receiving element and to have their storage operations controlled by a control section 111. The control section 111 controls an x shift register 112 and Y shift register 113 to allow an output Sn of the pixel unit to be selected by a switch (SWxn, SWyn) and externally output by an output section 114.

Further, in FIG. 4C, an explanation will be made below about the above-mentioned image pick-up device 6 functionally divided in two sections. As shown in FIG. 4C, the image pick-up element 6 comprises an image pick-up section 100 for the use of the pixel signal for imaging purpose and a focus detection section 200 for the use of the pixel signal for the focus detection purpose. The image pick-up section 100 is formed at a substantially whole surface and focus detection section 200 is formed at its parts. Further, at an imaging surface 120, a focus detection area 200A is arranged on the optical axis and the focus detection areas 200B, 200C are arranged at an the focus position and in a direction perpendicular to the focus detection area 200A.

At the front surface of the photodiode serving as the light receiving element, on the other hand, a corresponding microlens is constructed. As the technique for improving the light sensitivity of the image pick-up device, a so-called on-chip microlens technique has been established whereby the microlens is provided in a position corresponding to the respective photodiode to allow incident light to condense effectively at the light receiving section. In the image pick-up section 100, the microlens is so set as to obtain a maximal light sensitivity as set out above.

Figure 4A:
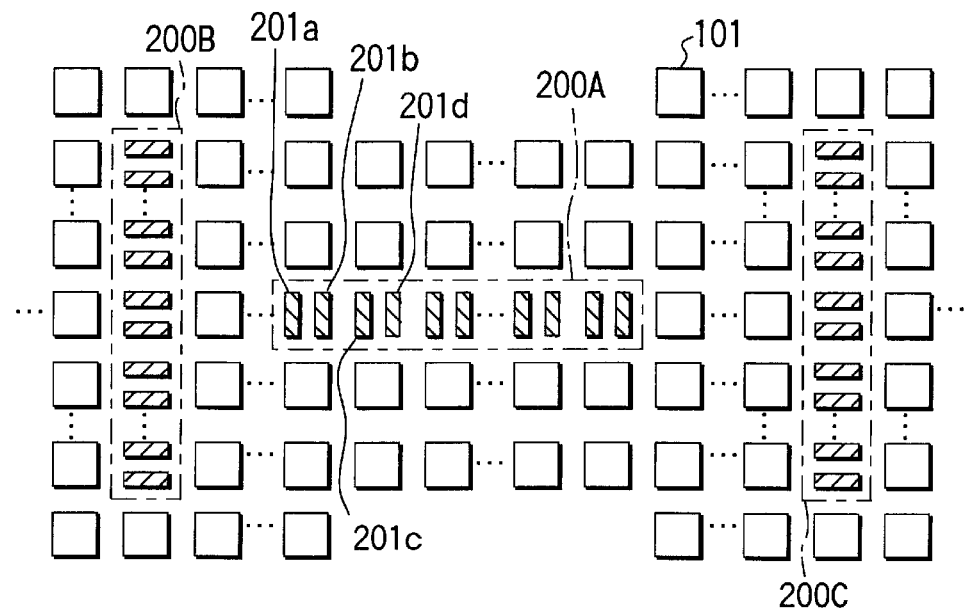
FIG. 4A shows an array of photodiodes comprised of light receiving elements on the image pick-up device 16.

FIG. 4A shows a array of photodiodes serving as the light receiving elements on the image pick-up device 16. At the focus detection section 200A to 200C, paired photodiodes 201a, 201b are arranged as a plurality of unit arrays and photodiodes 101 are arranged as a plurality of unit arrays at the image pick-up section 100.

Figure 4B:
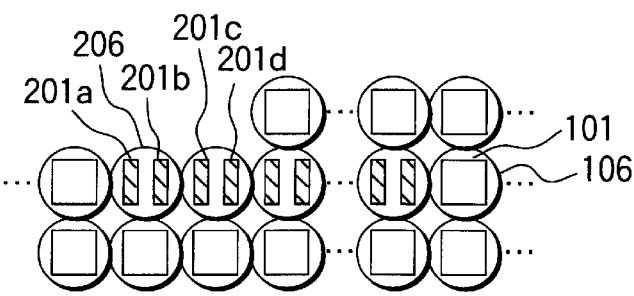
FIG. 4B is a view showing an array of photodiodes and microlenses.
Figure 4C:
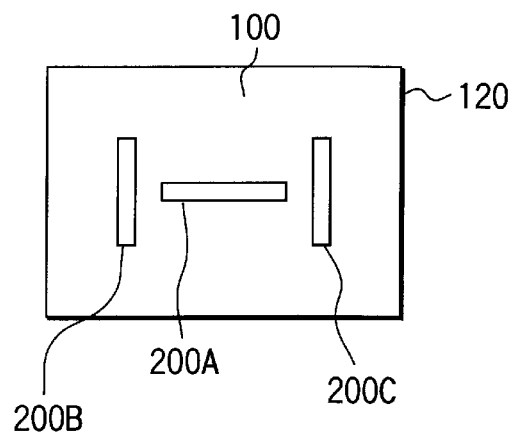
FIG. 4C is a view showing two sections into which the image pick-up device 6 is functionally divided.

FIG. 4B shows an array of photodiodes and microlenses.

At the focus detection sections 200A to 200C, the microlens 206 is provided for one pair of photodiodes 201a, 201b and, at the image pick-up section 100, the microlens 106 is arranged for the photodiode 101.

Figure 5:
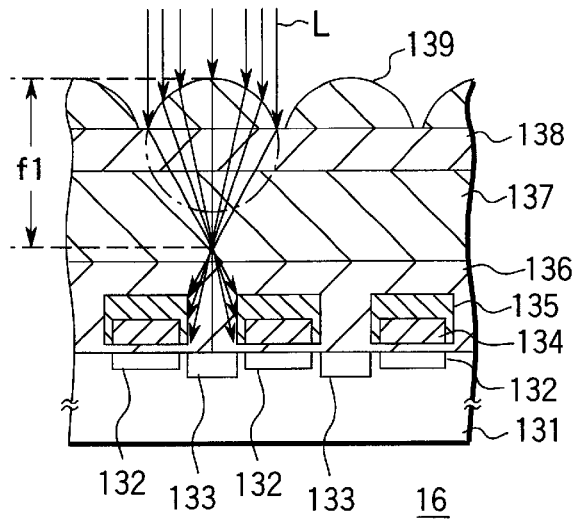
FIG. 5 is a general cross-sectional view showing an image pick-up device with on-chip microlenses formed thereon.

FIG. 5 is a view showing a general cross-sectional view of the image pick-up element with the on-chip microlenses formed thereon. In this connection it is to be noted that the image pick-up section 100 of the image pick-up device 6 in the image pick-up apparatus of the present invention is of substantially the same structure as that of FIG. 5.

As shown in FIG. 5, photodiodes comprised of a light receiving section 133 are formed as diffusion layers, etc., in a semiconductor silicon substrate 131. A circuit section 132 constituting a circuit for amplifying an output of the photodiode, gate electrode 134, etc., are covered with a corresponding light shielding film 135. Further, the light receiving section 133 is formed in a manner to correspond to an opening of the light shielding film 135 and a color filter 137 is formed over the light receiving section 133 and light shielding film 135, with a transparent flat surface layer 138 being located between the color filter 137 and a microlens 139. The microlens 139 is formed over the color filter 137, with a transparent flat surface layer 136 being located between the color filter 137 and the combination of the light receiving section 133 and the light shielding film 135, and has a spherical surface of a focal length F1 and a predetermined curvature r.

Figure 6:
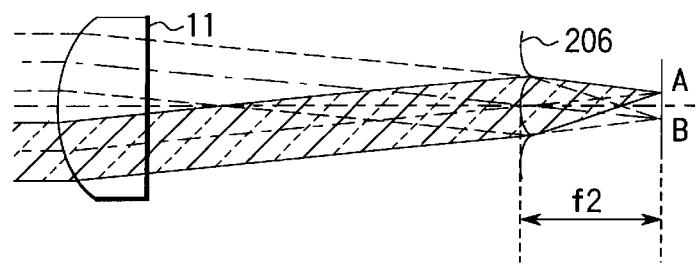
FIG. 6 is a view showing a manner in which light passing through an image-taking optical system 11 is pupil-divided and respective divided light beams are incident onto a pair of light receiving elements A, B.

On the other hand, a microlens 206 corresponding to a focus detection section 200 is different from the microlens 106 (139) in terms of their characteristics such as the curvature, focal length, etc., and the photodiodes A, B constituting a pair of light receiving elements are arranged substantially at a focal plane of the microlens 206. And the microlens 206 allows the light which passes through the image-taking optical system 11 (same as the image-taking optical system 1) to be pupil-divided into beams as shown in FIG. 6 so that these light beams are incident on one pair of light receiving elements A, B.

It is to be noted that, since the focus detection principle is the same as that of the phase difference detection system as disclosed in the above-mentioned U.S. Pat. No. 4,185,191, any detailed explanation of it is omitted here.

Figure 7:
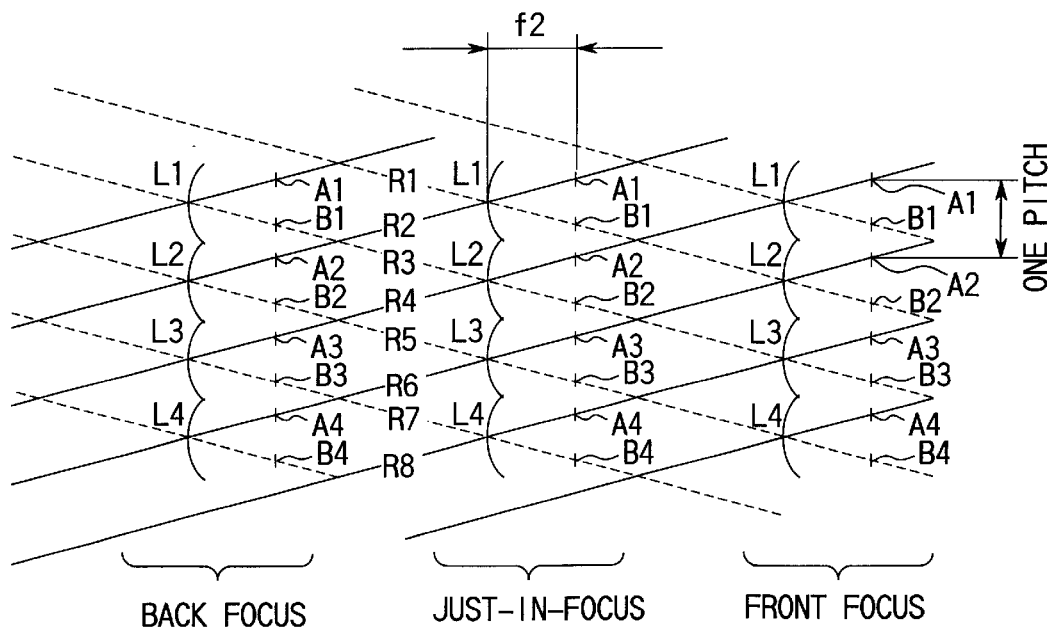
FIG. 7 is a view showing respective examples of a just-in-focus, front focus and back focus state in the focus detection section 200.

FIG. 7 shows respective examples of a just-in-focus, front focus and back focus in the focus detection section 200 as will be explained below. In actual practice, however, microlens Ln group and light receiving elements (An, Bn) group are fixed while the position of the image-taking optical system 1 is moved. Here, for convenience in explanation, an explanation will be given below of a relative-positional relation with the position of the image-taking optical system 1 assumed as being fixed.

The focal length of the microlens Ln is set to be f2, a value substantially equal to a distance between the microlens Ln and the light receiving elements An, Bn.

At the time of being in a just-in-focus state, light beams R1, R2, and R3, R4, . . . coming from the same subject light and passing through different exit pupils are such that a coincidence occurs in amounts of light beams received by those elements An and Bn adjacent to each other with the optical axis of the respective microlens Ln as a center. For example, to the light beams R3, R4 the microlens L2 and elements A2, B2 correspond.

In the case of the front focus, a coincidence occurs in amounts of light beams received by the elements A, B past different microlenses, that is, amounts of light beams received by non-adjacent elements A, B. For example, to those light beams R3, R4 coming from the same subject light the microlens L3 and element B3 and microlens L1 and element A1 correspond, respectively, and a corresponding image is displaced by two pitches.

In the case of the back focus, those detection elements coinciding in their amount of light received are adjacent but the light beams incident on these adjacent light receiving elements come past different microlenses. For example, to the light beams R3 and R4 coming from the same subject light the microlens L1 and light receiving element B1 and microlens L3 and light receiving element A3 correspond, respectively, and an image is displaced by two pitches in a direction opposite to that at the time of the front focus.

In this way, an image displacement is produced in accordance with an out-of-focus amount. Since, in actual practice, the focus detection accuracy is lowered in the case of the above-mentioned one-pitch-unit image displacement amount (phase difference amount), the focus detection is made in units of below 1 pitch through the use of the known interpolation calculation processing, etc. By detecting the image displacement amount in this way it is possible to find an out-of-focus amount of an image-taking lens.

Here, out of the pixel units of the two-dimensional horizontal/vertical array as shown in FIG. 3, the pixel unit 110 positioned at the image pick-up section 100 will be explained below with reference to FIG. 8A.

Figure 8A:
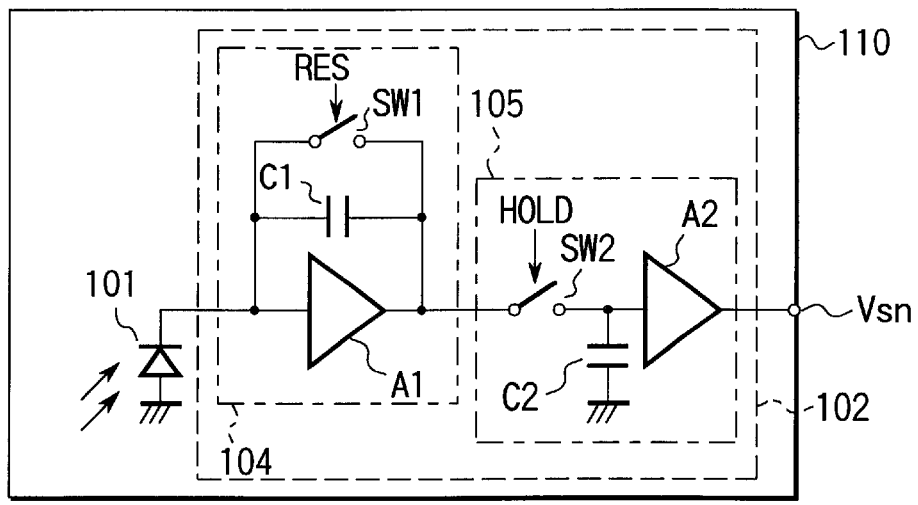
FIG. 8A is a schematic view showing an arrangement of a pixel unit 110 at an image pick-up section 100 in a two-dimensional horizontal/vertical array of pixel units as shown in FIG. 3.

In FIG. 8A, in the pixel unit 110, the output of a photodiode 101 is input to a pixel amplifying circuit 102 for amplifying a charge produced in the photodiode 101. The pixel amplifying circuit 102 comprises an initial stage amplifier 104 and sample holding section 105.

The initial stage amplifier 104 comprises an amplifier A1, storage capacitor C1 and switch SW1 and constitutes an integrator. The output of the initial stage amplifier 104 is input to the sample holding section 105. The sample holding section 105 comprises a switch SW2, holding capacitor C2 and buffer A2.

With the switches SW1 and SW2 ON, the pixel unit 110 is initialized and, with the switch SW1 OFF, starts a storage operation. With the switch SW2 OFF, the storage level is held in the holding capacitor C2 and the storage operation is completed. The ON-OFF timing of the switches SW1 and SW2 is controlled by the control section 111.

The storage level held in the holding capacitor C2 is output to Vsn through the buffer A2 and it is selected by the X shift register 112 and Y shift register 113 and output to the output section 114.

The above-mentioned focus detecting section 200 comprises an array of pixel units 210 comprising a pair of photodiodes 201a, 201b for receiving light beams divided by the exit pupil of the image-taking lens 11 through the microlens group and pixel amplifying circuits 202a, 202b for amplifying a charge generated in the photodiodes 201a, 201b.

Figure 8B:
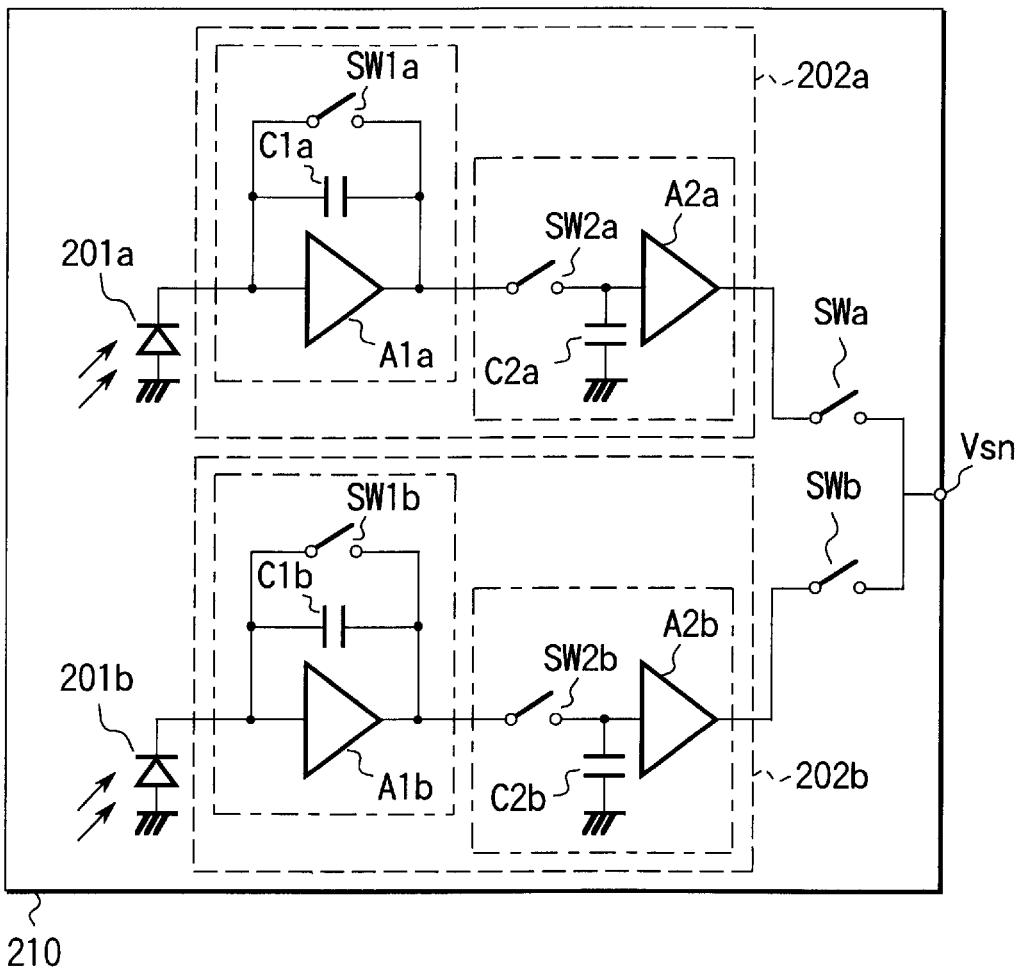
FIG. 8B is a detailed schematic view showing the pixel unit 10.

FIG. 8B is a view showing a detail arrangement of the above-mentioned pixel unit 210. As shown in FIG. 8B, the pixel amplifying circuits 202a, 202b constitute the same circuit arrangement as the above-mentioned pixel amplifying circuit 102. The outputs of the pixel amplifying circuits 202a and 202b are selectively connected to the outputs Vsn respectively through switches SWa and SWb controlled by the control section 111. Like the above-mentioned pixel unit 103, the output Vsn is selected by the X shift register 112 and Y shift register 113 outside the pixel unit 210 and output to the output section 114.

Figure 9:
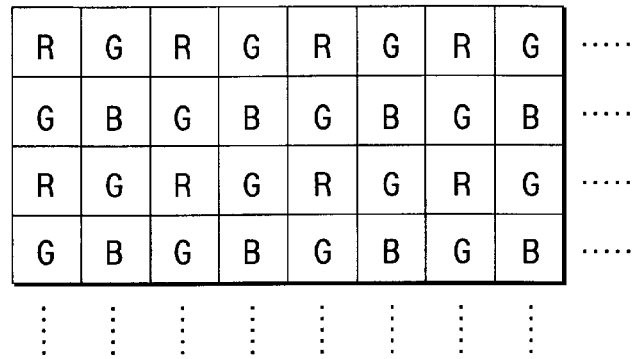
FIG. 9 is a view showing a bayer array.

A color filter is arranged in front of the photodiode 101 of the image pick-up section 100. This color filter array is comprised of the so-called bayer array as shown in FIG. 9. That is, in FIG. 9, R, G, B show a color filter for allowing red, green and blue to be passed selectively.

In front of the photodiodes 201a, 201b of the focus detection section, on the other hand, no color filter is arranged and only the image pick-up section 100 is arranged.

This makes it possible to perform processing by the known algorithm such as making focus detection on a plurality of focus detection areas 200A, 200B and 200C, automatically selecting, out of these, a nearest subject for instance, etc. Further, the photographer can select an AF area by the area select switch 49 as will be set out below and set a just-in-focus state regarding that area. In the focus detection area 200A, focus detection can be made on a subject having a horizontal contrast against an image-taking screen 120, for example a vertical line.

In the focus detection areas 200B, 200C, on the other hand, focus detection can be made on a subject having a vertical contrast against an image-taking screen 120 shown in FIG. 4C, for example, a horizontal line. Thus, focus detection can be made on the subject having a only one-direction contrast.

Incidentally, at the time of creating an image-taking picture, it is necessary to correct image data because no image data can be obtained on the above-mentioned focus detection areas 200A to 200C.

A method for interpolating the image data will be explained below in more detail.

First, with respect to the photodiode sections of the focus detection areas 200A to 200C, correction is made with the use of the pixel signals of the photodiodes situated at peripheral pixel areas and belonging to the image pick-up area 100 and image data corresponding to the focus detection area is prepared.

Let it be assumed that the section of the photodiodes 201a, 201b in the focus detection section 200A in FIG. 4A corresponds to the green (G) in accordance with the array rule of the color filter. This section corresponds to pixel data Ga in FIG. 13 having the same positional relation as in FIG. 4A and the pixel data Ga is calculated, by the following equation, with the use of the pixel signals of the photodiodes G1 to G4 in the image pick-up section 100 belonging to the same color as Ga and corresponding to diagonally upper/lower front/back positions.

$$Ga=(G1+G2+G3+G4)/4 \quad (1)$$

Similarly, in FIG. 4A, the section of the photodiodes 201c, 201d in the focus detection area 200A corresponds to the blue (B) in accordance with the array rule of the color filter. This section corresponds to pixel data Ba in FIG. 13 having the same positional relation as in FIG. 4A and the pixel data Ba is calculated, by the following equation, with the use of the pixel signals of the photodiodes B1, B2 belonging to the same color as Ba and corresponding to vertically two-pixels-displaced positions.

$$Ba=(B1+B2)/2 \quad (2)$$

As an alternative calculation method in place of the equation (2) calculation is made, by the following equation, with an additional use of the photodiodes B3 to B6 in the image pick-up section 100 belonging to the same color as Ba and corresponding to diagonally two-upper/lower-displaced positions.

$$Ba=(B1+B2+B3+B4+B5+B6)/6 \quad (3)$$

Although the above-mentioned calculation is made with the use of a simple average, it may be possible to calculate it by giving weights to nearby pixels and averaging corresponding values. Although an explanation has been made about the focus detection area 200A only, it may be possible to perform similar processing also against the focus detection areas 200B, 200C. Although the focus detection area 200 has been explained as being an area for the color filters G, B, similar processing can also be done with respect to the areas R, G simply by the replacement of conditions used. In this way, it is possible to prepare image data on the focus detection areas 200A to 200C against a lack of image-taking picture data.

The above-mentioned calculation processing is performed by the video signal processing section 42.

The video signal processing section 42 performs processing on an electric signal as a pixel signal from the image pick-up device 16 and creates a video signal. The detailed arrangement of the video signal processing section 42 is as shown in a block view in FIG. 10.

Figure 10:
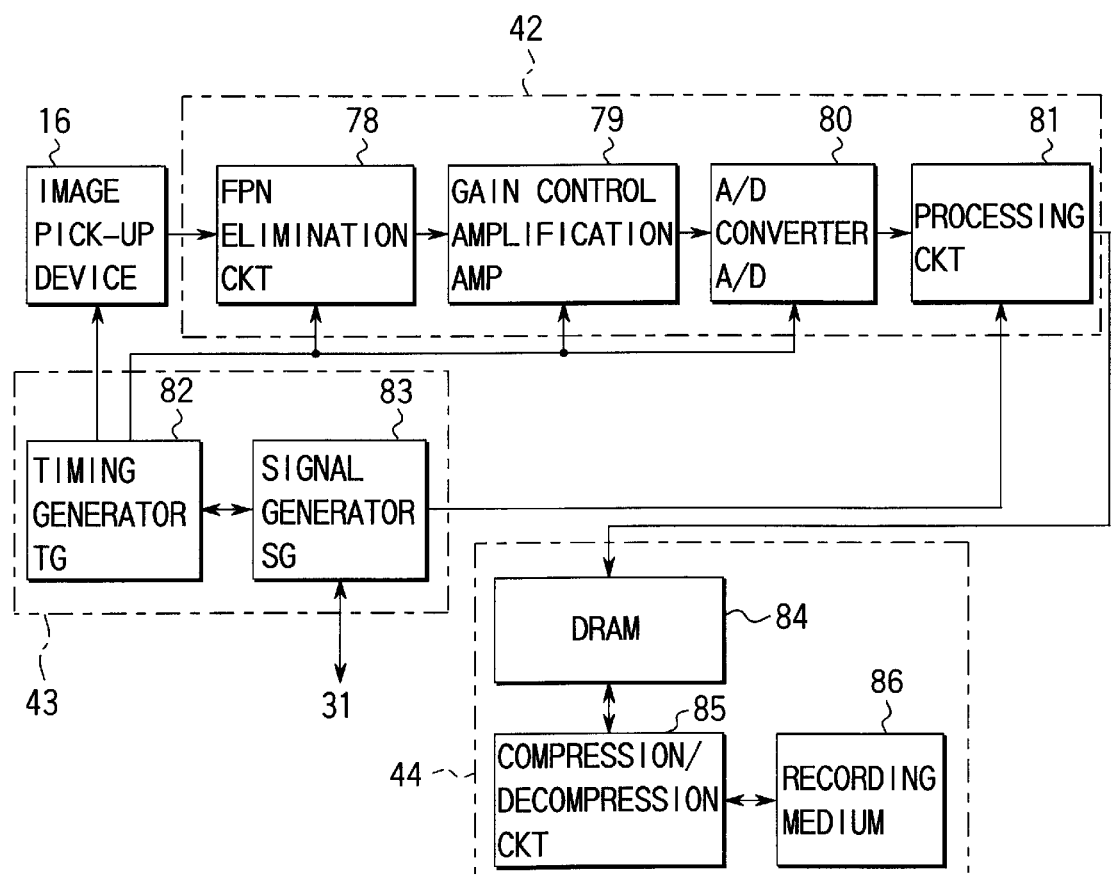
FIG. 10 is a view showing a detailed arrangement of a video signal processing section 42.

That is, in FIG. 10, a fixed pattern noise (FPN) elimination circuit 78 eliminates an FPN, etc., from the image signal of the image pick-up device 16. A gain control amplifier AMP 79 amplifies the output of the FPN elimination circuit 78 with a predetermined gain.

The A/D converter 80 converts the output of the gain control amplifier 79 to a digital signal. The processing circuit 81 performs various kinds of processing on the video signal converted to the digital signal.

The image pick-up device control section 43 outputs a drive signal to the image pick-up device 16 and controls the operation of the device 16. The control section 43 comprises a timing generator 82 and signal generator 83.

That is, the timing generator (TG) 82 generates a drive signal, such as a drive pulse, for driving the image pick-up device 16 and generates a sample holding pulse of the FPN elimination circuit 78 and A/D conversion timing pulse of the A/D converter 80. The signal generator (SG) 83 generates a signal for taking a synchronization between the timing generator 82 and the microcomputer 31.

The recording section 44 comprises a DRAM 84, compression/decompression circuit 85 and recording medium 86. The video signal (pixel data) output from a processing circuit 81 in the video signal processing section 42 is stored in the DRAM 84. The compression/decompression circuit 85 performs compression processing for recording the pixel data accumulated in the DRAM 84 as a compressed data amount and decompression processing for decoding the compressed data read out from the recording medium 86. The recording medium 86 stores the compressed still-image data.

Figure 11:
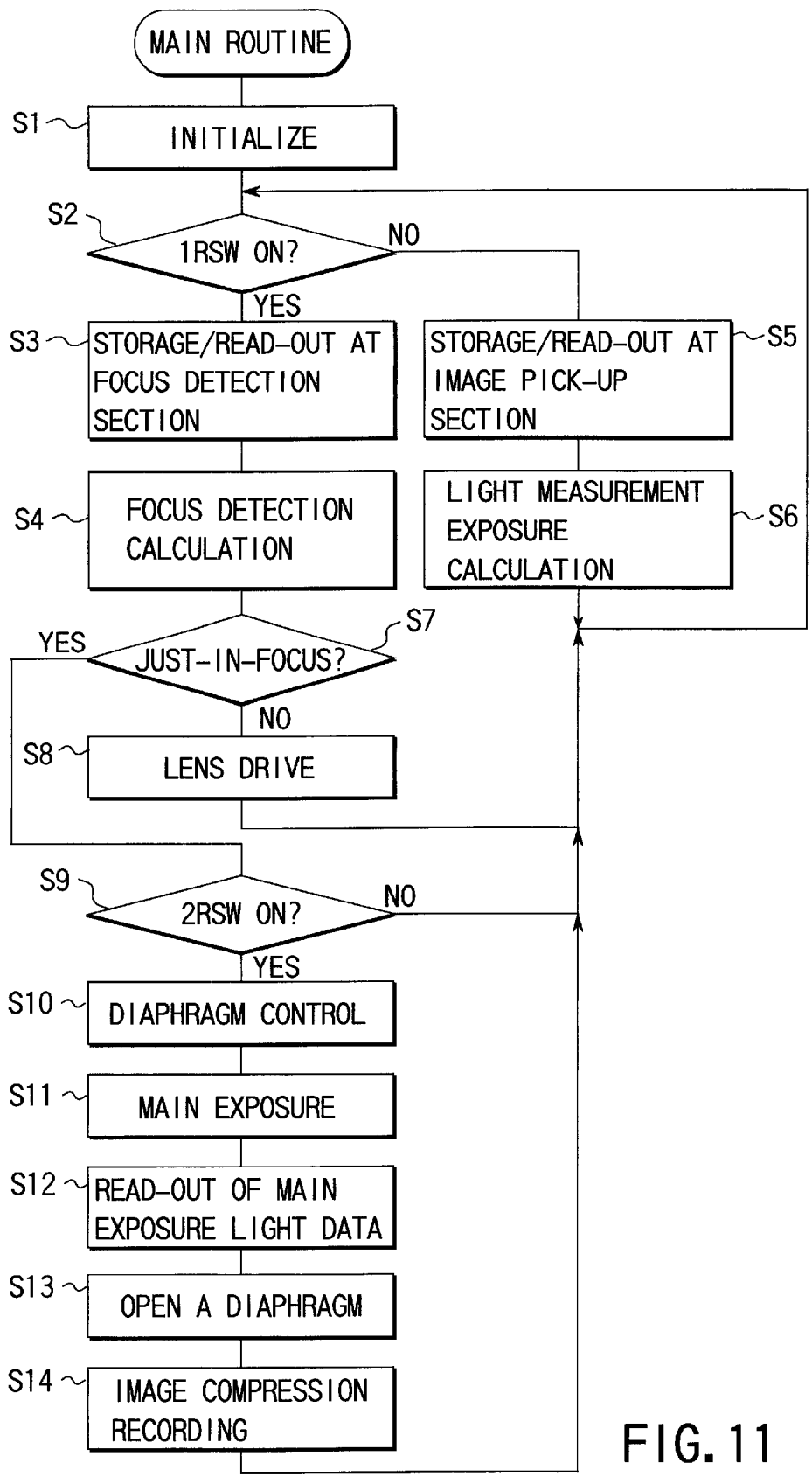
FIG. 11 is a flow chart for explaining, in detail, an operation of a microcomputer 31 in the image pick-up apparatus of the first embodiment.

The operation of the microcomputer 31 will be explained in more detail below with reference to the flow chart in FIG. 11. In the following explanation, reference is properly made to a timing chart in FIGS. 12A–12G.

With a power supply switch SW, not shown, ON or battery unit inserted, the operation of the microcomputer 31 is started and a sequence program stored in the internal ROM 31b is implemented.

That is, in the main sequence, each block in the image pick-up apparatus is initialized (step S1) and then the state of the 1RSW 47 is detected (step S2).

With the 1RSW 47 OFF, the storage (light exposure) in the image pick-up section of the image pick-up device 6 and image pick-up operation (reading-out operation) are performed (step S5) and, based on the video signal of the image pick-up section 100 from the video signal processing section 42, the light measuring/exposure calculation section 45 performs a light measuring/exposure calculation and calculates a diaphragm control value of the diaphragm 12 at a main light-exposure image-taking (image recording) time, the speed of the electronic shutter of the image pick-up device 6, etc. (step S6) and control is returned back to step S2.

With the 1RSW 47 ON, on the other hand, the storage operation (AF exposure) of the focus detection section 200 in the image pick-up device 6 is performed, the image signal of the focus detection section is read out (step S3) and the focus detection calculation is made based thereon (step S4).

Figure 12:
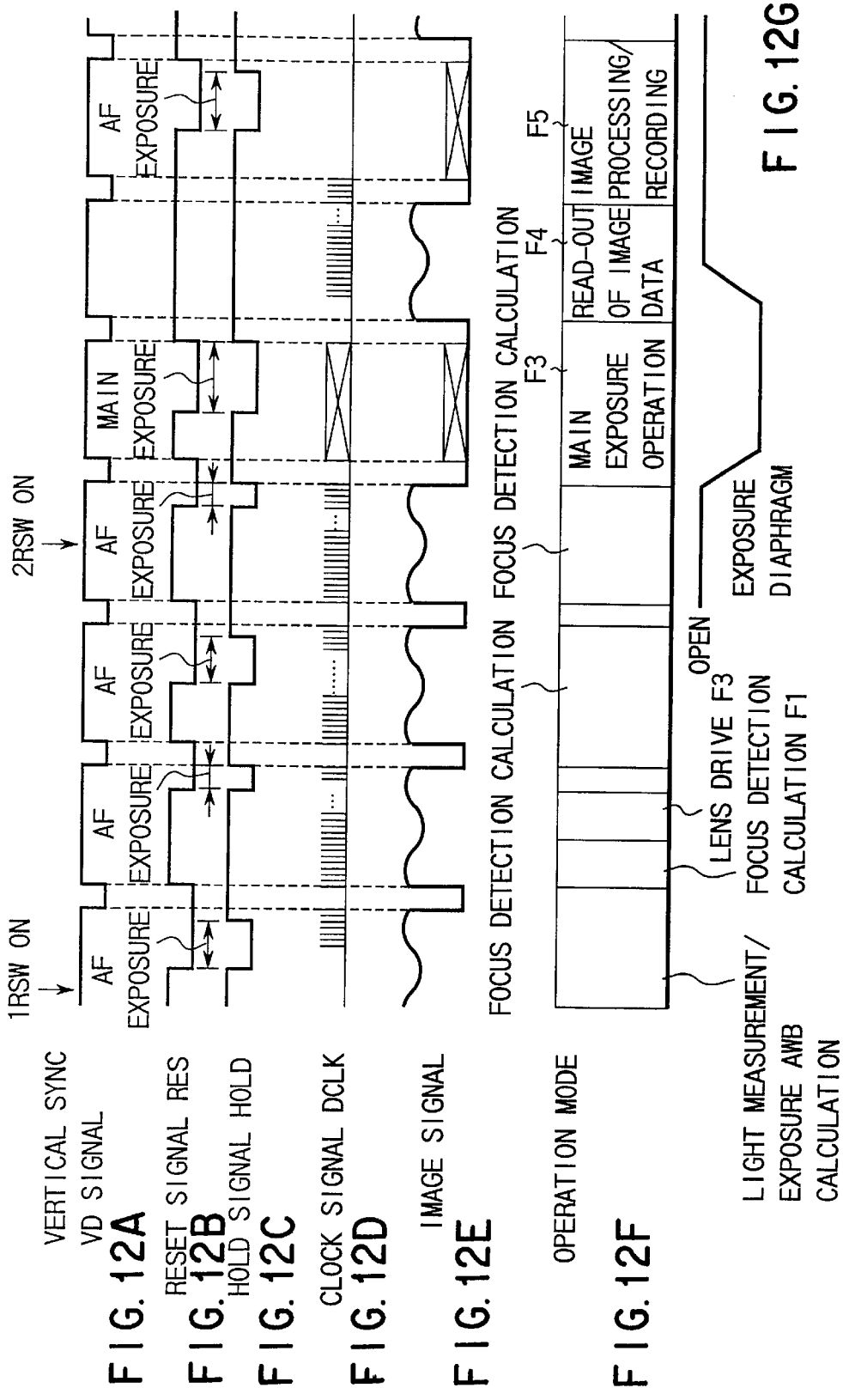
FIG. 12A is a view showing a vertical sync VD signal.
FIG. 12B is a view showing a reset signal.
FIG. 12C is a view showing a hold signal HOLD.
FIG. 12D is a view showing a clock signal.
FIG. 12E is a view showing an image signal.
FIG. 12F is a view showing an operation mode.
FIG. 12G is a view showing a state of an exposure diaphragm.

In this connection it is to be noted that the known method, such as implementing this focus detection calculation in a timing F1 in FIG. 12F, comparing results of calculation at the focus detection areas 200A, 200B, 200C, selecting the nearest distance area, etc., can be adopted.

Then, it is decided whether or not the result of the focus detection calculation is in a just in-focus state (steps S7). If YES, control goes to step S9. If NO, control goes to step S8 and calculation is made of a movement amount of the focusing lens 1a on the basis of a result of the focusing detection calculation to obtain a just-in focus state and a lens drive operation is so done. And control goes back to step S2 and the above-mentioned AF operation is repeated. The drive operation of this focusing lens 1a is implemented at a time F2 in FIG. 12F.

At step S9, detection is made on whether or not the 2RSW 48 is turned ON and, with the 2RSW ON, control goes to step S10. With the 2RSW 48 OFF, control is returned back to step S2 and the AF operation is continued while a wait is made for the 2RSW 48 to be turned ON.

At step S10 and the following steps, the main light exposure operation is carried out.

That is, the microcomputer 31 controls the diaphragm control section 33 and the diaphragm 2 is stopped down (step S10) to a value for exposure. And the image pick-up device control section 43 turns a charge resetting signal RES OFF (see FIG. 12B) to start the storage of the image pick-up element 6 and effects control with an electronic shutter speed based on the exposure calculation to performed a main light exposure (step S11).

The main exposure operation is made at a time of F3 in FIG. 12F.

By this electronic shutter operation, a charge storage signal HOLD is generated, under the image pick-up device control section 43, at a predetermined timing corresponding to the shutter speed and a storage charge of the photodiode 101 is held (see FIG. 12C).

Then the image pick-up device control section 43 outputs an image read-out signal DCLK to the image pick-up device 16 and the video signal processing section 42 A/D converts an image signal (image pick-up device signal) of the image pick-up section 100 which is output in synchronism with the signal DCLK (see FIG. 12D) to a digital form and it is read out (step S12). It is to be noted that the read-out of the image data is carried out at a time of F4 in FIG. 12F.

The microcomputer 31 controls the diaphragm control section 33 to allow a diaphragm opening command to be sent to set the diaphragm 12 in an opening state (step S13) and performs compression, etc., processing on the read-out image signal and allows it to be stored in the recording medium (step S14). These image processing and recording operations are done at a time of F5.

By doing so, a series of image-taking operations is completed and control goes back to step S2 and the above-mentioned operations are repeated.

A second embodiment corresponding to a variant of the first embodiment will be explained below with reference to FIGS. 14 and 15. In this second embodiment, a color filter array over the photodiode array is different from that of the first embodiment.

That is, although, in the first embodiment, no color filter is arranged at the focus detection areas 200A to 200C, the second embodiment is such that, as shown in FIG. 14, a color filter is regularly arranged, as in the image pick-up area 100 including the focus detection areas 200A to 200C, in accordance with the bayer array.

At a focus detection time, focus detection calculation is effected by selecting the pixel data of the same color in a filter at the focus detection areas 200A to 200C.

That is, in FIG. 14, on the pixel signal of a color G or pixel signal of a color B, the focus detection calculation is made individually and both defocus amounts resulting from these calculations are average-processed. In this case, therefore, the detection pitch is made 2-times coarser but, through this average processing, focus detection precision is never lowered. In the case of the color G, use is made of the image signals of the photodiodes 201a, 201b, 201e, 201f . . . .

Needless to say, it may be possible to, out of the results of the focus detection calculations, select a more reliable one. Although, in the above-mentioned first embodiment, no storage operation is done at the focus detection area 200 at a recording image pick-up time, a storage operation is carried out, in the second embodiment, at the same time as at the image pick-up section 100. And the image signal at the focus detection area 200 is also used as the data of a recording image.

Here an explanation will be made below about preparing image data of the focus detection area 200 at a time of preparing a recording image. In FIG. 14, those portions of pixel signals 201a and 201b in the focus detection area 200 correspond to the color G in accordance with the regularity of the bayer array.

The pixel data A1 of a portion shown in FIG. 15 having the same positional relation as in FIG. 14 is found, by the following equation, with the use of Ga given as an addition of pixel signals 201a+201b and further pixel signals G1 to G4 corresponding to those diagonally upper/lower front/back positions around the Ga.

$$A1=(Ga+G1+G2+G3+G4)/5 \qquad (4)$$

The signal Ga of the pixel signal 201a+201b in the focus detection area 200A is a signal corresponding to beams into which light is pupil-divided and, in a just-in-focus state, becomes the same light beam state as the pixels in the image pick-up state 100 except a difference of their light amounts and it is obtained as better image data through the processing of the equation (4).

Then, in FIG. 14, the portions of pixel signals 201c, 201d in the focus detection area 200 correspond to a color B and similar processing is done thereon.

The pixel data A2 of the corresponding portion in FIG. 15 is found, by the following equation, with the use of Ba corresponding to the pixel signals 201c+201d and further pixel signals B1 and B2 corresponding to two vertically tow-pixels displaced positions.

$$A2=(Ba+B1+B2)/3 \qquad (5)$$

Further, as in the case of the variant of the first embodiment, the pixel data A2 may be found with the use of further B3 to B6 corresponding to diagonally upper/lower two-pixels displaced positions as well as (Ba+B1+B2).

$$A2=(Ba+B1+B2+B3+B4+B5+B6)/7 \qquad (6)$$

In the second embodiment, as set out above, it is possible to prepare also the image data in the focus detection areas 200A to 200C with the use of the pixel signal information in the focus detection areas 200A to 200C at the time of preparing the recording image and to improve the quality of an image in the focus detection area 200 portion.

A third embodiment of the present invention will be explained below with reference to FIGS. 16A and 16B.

This third embodiment corresponds to a variant of the second embodiment and the pixel unit is different from that of the first embodiment in their arrangement. A color filter is arranged also at a focus detection area 200 as in the case of the second embodiment.

Figure 16A:
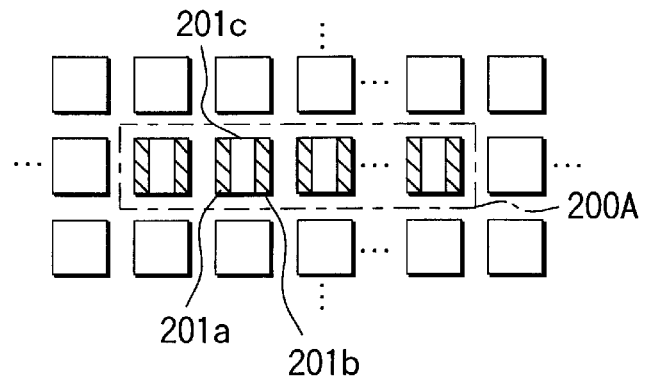
FIG. 16A is a view showing an array of a focus detection area 200 in the image pick-up apparatus according to a third embodiment.

That is, in the focus detection area 200, as shown in FIG. 16A, a photodiode 201 for image pick-up use is provided in addition to pair of photodiodes 201a, 201b.

Figure 16B:
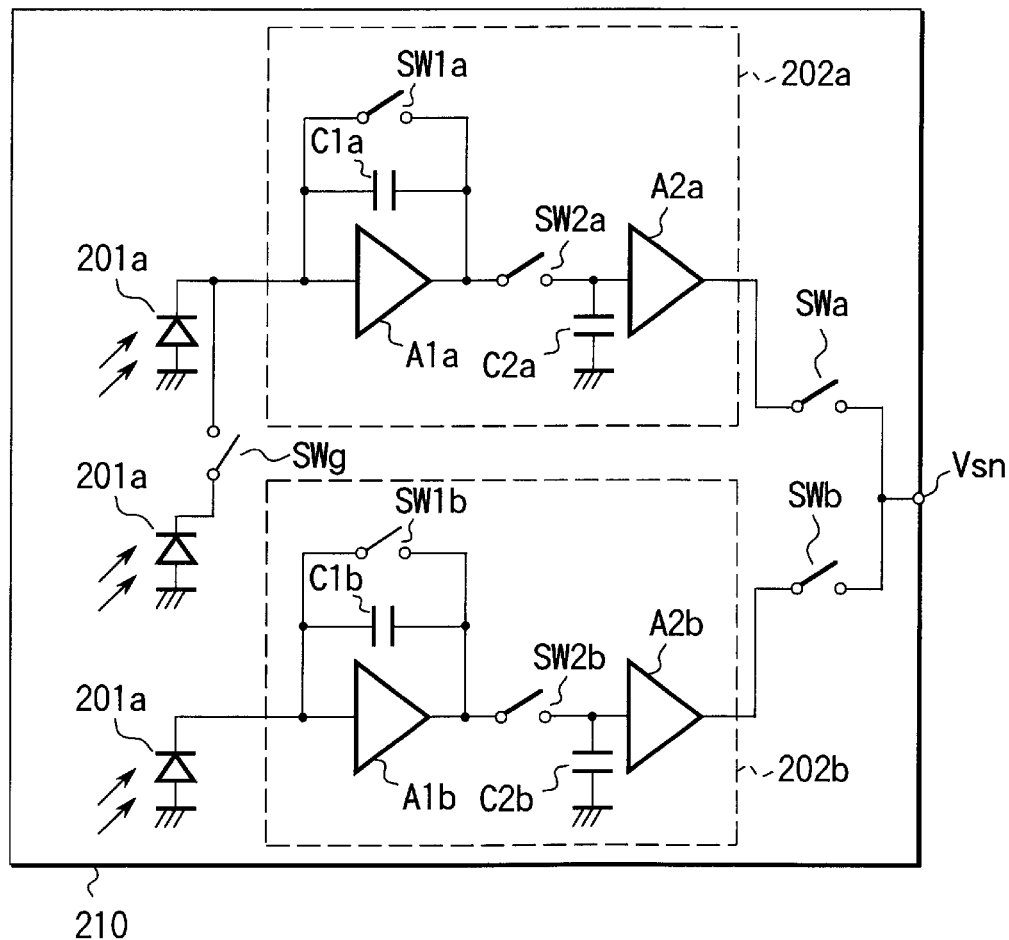
FIG. 16B is a view showing an arrangement of a pixel unit 210 of a focus detection section 200.

Further, FIG. 16B shows, in detail, an arrangement of a pixel unit 210 of the above-mentioned focus detection section 200. In FIG. 16B, at a focus detection time, a storage operation is done with a switch SWg OFF and, in this case, it is possible to perform exactly the same focus detection operation as in the first embodiment.

Although, at a recording image pick-up time, the focus detection sections 200A to 200C perform no storage operation in the first embodiment, the third embodiment performs a storage operation, at the same time as the image pick-up section 100, as in the case of the second embodiment.

At this time, with switch Swg ON, the output of the photodiode 201c is also input to an image amplifying circuit 202a and not only pupil-divided light beams but also those broader light beams including the pupil-divided light beams can be received and converted to a voltage signal.

By adding an addition pixel signal from photodiodes 201a and 201c and pixel signal from a photodiode 201b it is possible to obtain an image signal corresponding to the case of all the light beams being received. Subsequent image data preparing processing at the focus detection area 200 is the same as in the second embodiment.

Incidentally, as set out above, the microlens 106 of the image pick-up section 100 and microlens 206 of the focus detection area 200 differ in their optical characteristics and light receiving amounts resulting from their corresponding photodiodes differ. Further, the light receiving amount is related to the area of the photodiode. Such a light amount difference is beforehand stored in the EEPROM 31e and corrected for each pixel unit of the focus detection area 200 so as to be matched to the image pick-up section 100. In this way, the image data is prepared on the focus detection areas 200A to 200C to obtain a better-quality image.

A fourth embodiment of the present invention will be explained below with reference to FIGS. 17 and 18.

This fourth embodiment constitutes a variant of the first embodiment and is different therefrom in terms of their photodiode array and color filter array.

Figure 17:
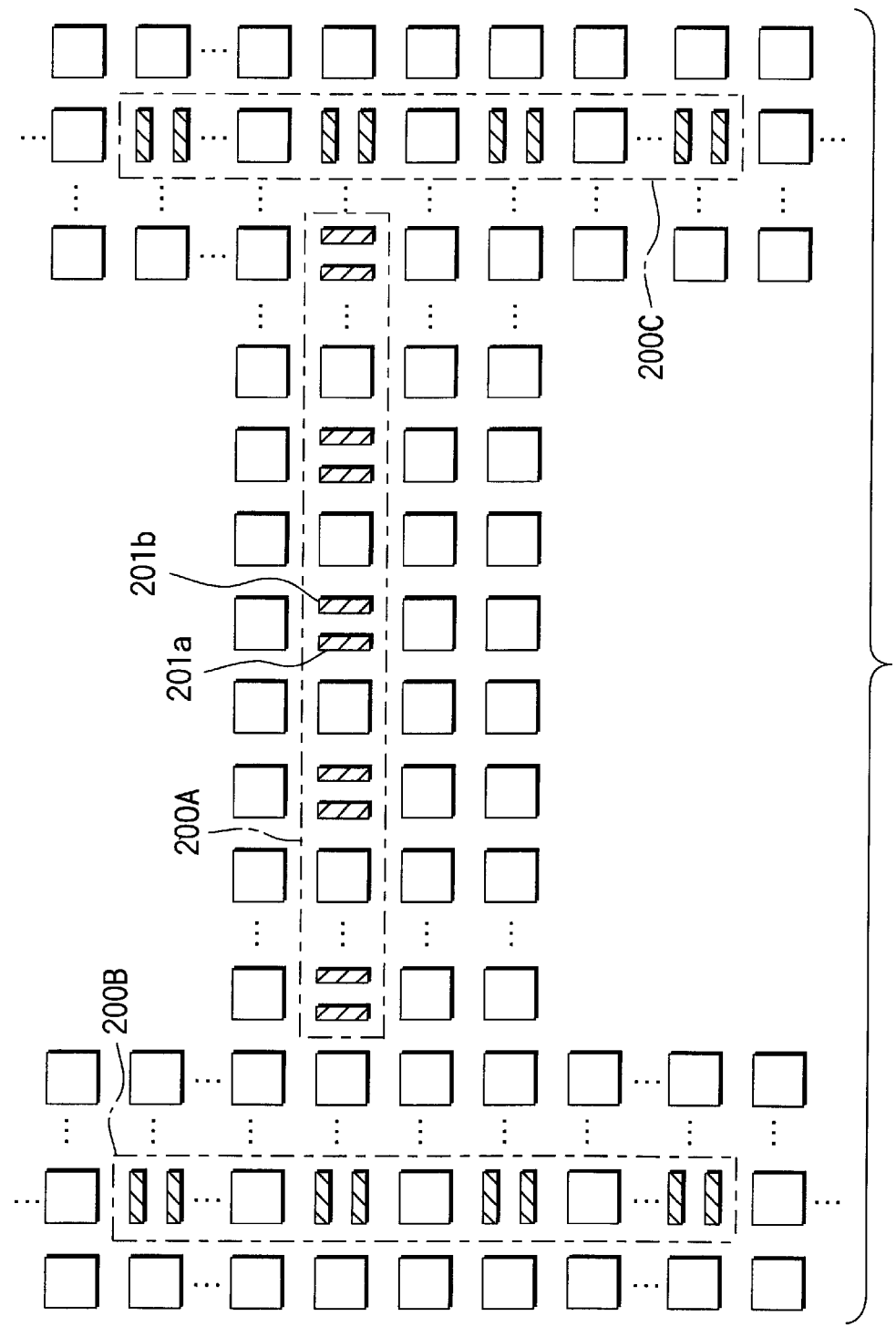
FIG. 17 is a view showing a focus detection area array in an image pick-up apparatus according to a fourth embodiment.

As shown in FIG. 17, in focus detection sections 200A to 200C, a unit of a pair of photodiodes 201a, 201b for focus detection and image pick-up photodiode 101 are alternately arranged.

FIG. 18A has the same positional relation as in FIG. 17.

As shown in FIG. 18A, no color filter is arranged in the focus detection sections 200A to 200C at A1, A2, . . . , comprised of photodiodes 201a, 201b and, in the intervening photodiode 101 for an image pick-up use, a blue (B) filter is arranged in accordance with a color filter array of the image pick-up section 100.

For example, a portion A1 corresponding to the paired photodiodes 201a, 201b in the focus detection area 200A corresponds to a color G in accordance with the regularity of a color filter array. As in the case of the first embodiment, the image data of the portion A1 is found, by the equation (1), with the use of peripheral pixel signals G1 to G4.

On the other hand, the portions A2, A4, . . . , requiring the correction in the above-mentioned first embodiment can be directly used as the image pick-up pixel data.

In the variant, a G, B relation in FIG. 18B is inverted when being compared with that of FIG. 18A. In this case, the portion A1 corresponds to the color B and this image data is found, as in the first embodiment, with the use of the pixel signals of pixel signals B1 and B2 as peripheral pixels.

On the other hand, the portions A2, A4, . . . , corresponding to the color G can be directly used as the image pick-up pixel data. Since the resolution of the image largely depends upon the color G, this case is advantageous in terms of the image resolution. Even if the pixel of a color R is correspondingly used in place of the color B, exactly the same thing may be considered.

In the fourth embodiment, those deteriorated areas resulting from a loss of image data in the focus detection area 200 is decreased in comparison with the above-mentioned first embodiment and it is possible to obtain a better-quality image as a peripheral image.

In the above-mentioned arrangement, the detection pitch of the photodiodes for focus detection is 2 times that of the first embodiment and the focus detection precision is lowered to about one half. It is, however, possible to achieve an improved-quality image as a peripheral image at the focus detection areas 200A to 200C. With respect to the focus detection areas, it is known that, through a known interpolation calculation, etc., detection can be made with a precision of a detection pitch of 1/100 to 1/200. It is known, on the other hand, that, with the image-taking pixel pitch given as P, the focus adjusting precision required as the image pick-up device requires a detection precision of below 2P.

Therefore, the detection pitch of the photodiodes for focus detection, even if being given as, for example, 10. P, has an allowance of about 20 times (10. P. (1/100) <<2P) and there is no problem from the standpoint of the focus detection precision. In the fourth embodiment, therefore, the unit of a paired photodiodes 201a, 201b for focus detection and photodiode 101 for image pick-up use are alternately arranged. However, the present invention is not restricted thereto and it is possible to make a modification by, for example, arranging the unit (201a, 201b) and photodiode 101 at a proper interval array corresponding to a precision required.

According to the present invention, as set out above, the focus detection area is provided where the pupil-divided microlens group and paired light receiving element group (element group receiving the pupil-divided light beams) are formed on the same chip as the image pick-up device. And focus detection is effected based on the output of the light receiving element group and the picture-taking image data of the focus detection area is corrected with the image-taking pixel data. It is, therefore, possible for the present image pick-up apparatus to effect high-speed and high-accuracy focus detection at low costs and in a space-saving way and the prevent a picture-taking image quality being deteriorated.

Although the embodiment of the present invention has been explained as having the above-mentioned arrangement, the present invention is not restricted thereto and various changes or modifications of the present invention can be made without departing from the spirit and scope of the present invention.

Although, in the above-mentioned first to fourth embodiments, the image pick-up device has been explained as being a MOS type sensor, it is needless to say that a CCD and other types of solid-state image pick-up devices can be used. Although the bayer array has been adopted with respect to the color filter array, the present invention is not restricted thereto and it may be comprised of a complementary color-type color filter array, etc.

According to the present invention, as set out in detail below, it is possible to improve an AF speed at low costs and in a space-saving way without adding any new mechanism and optical system and do so with an accurate focus adjustment and to prevent a picture-taking image quality being deteriorated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image pick-up apparatus on which a chip-like image pick-up device for receiving subject light passing through a picture-taking lens and taking an image electronically is mounted, comprising:

a first light receiving element group which is formed on the chip-like image pick-up device and comprises a plurality of first light receiving elements arranged to allow the subject light which passes through the picture-taking lens to be received;

a first microlens group which is placed on the chip-like image pick-up device and comprises a plurality of microlenses arranged to respectively oppose the first light receiving elements of the first light receiving element group, for allowing the subject light which has passed through the picture-taking lens to converge on the first light receiving elements;

a second light receiving element group which is formed on the chip-like image pick-up device and comprises a plurality of second light receiving elements each comprising a pair of light receiving portions which receive the subject light which passes through the picture-taking lens;

a second microlens group which is placed on the chip-like image pick-up device and comprises a plurality of microlenses arranged to respectively oppose the second light receiving elements of the second light receiving element group for allowing the subject light which has passed through the picture-taking lens to be pupil-divided into light beams;

focus detection means for effecting focus detection based on outputs of the second light receiving element group;

correction means for correcting output signals corresponding to a subject image and to a focus detection area present at the second light receiving element group on the basis of outputs of the first light receiving element group; and image pick-up means for picking up the subject image based on signals obtained by correcting signals output from the first light receiving element group and signals output from the second light receiving element group by the correction means.

2. An image pick-up apparatus according to claim 1, wherein the correction means effects the correction based on predetermined outputs of the first light receiving element group present at a peripheral area of the second light receiving element group.

3. An image pick-up apparatus according to claim 1, wherein, in the focus detection area, the first light receiving elements and second light receiving elements are alternately arranged.

4. An image pick-up apparatus according to claim 1, wherein the microlens is arranged at one corresponding second light receiving element and at one corresponding first light receiving element to make a light sensitivity optimal.

5. An image pick-up apparatus according to claim 1, wherein a storage operation is performed also by the second light receiving element group arranged at the focus detection area and the image pick-up means picks up an image based on signals output from the first light receiving element group and signals output from the second light receiving element group.

6. An image pick-up apparatus according to claim 1, wherein the focus detection area comprises first and second areas and the second light receiving element group arranged at the first area effects focus detection of the subject having a horizontal contrast and the second light receiving element group arranged at the second area effects focus detection of the subject having a vertical contrast, and the focus detection means makes focus detection based on the outputs of the second light receiving element group at the first and second areas.

7. An image pick-up apparatus having an image pick-up device for receiving subject light passing through a picture-taking lens and taking an image electronically, comprising:

a first light receiving group having a plurality of first light receiving elements arranged to allow the subject light which passes through the picture-taking lens to be received;

microlens groups for allowing the subject light which passes through the picture-taking lens to be pupil-divided into light beams;

a second light receiving element group having a plurality of second light receiving elements each comprised of a pair of light receiving portions which receive the light beams of the subject light;

focus detection means for effecting focus detection based on outputs of the second light receiving element group;

correction means for correcting a subject image corresponding to a focus detection area present at the second light receiving element group on the basis of the outputs of the first light receiving element group; and image pick-up means for picking up an image based on signals output from the first light receiving element group and signals output from the correction means, wherein, in front of at least the first light receiving element group, a color filter is arranged as a color array based on a predetermined rule, and the correction means corrects color information based on the predetermined rule at an area present in the second light receiving group and does so based on the outputs of those elements of the first light receiving element group having the same color as that of the color information in the color filter.

8. An image pick-up apparatus according to claim 7, wherein the predetermined rule corresponds to a bayer array or a complementary color type color filter array.

9. An image pick-up apparatus having an image pick-up device for receiving subject light passing through a picture-taking lens and taking an image electronically, comprising:

a first light receiving group having a plurality of first light receiving elements arranged to allow the subject light which passes through the picture-taking lens to be received;

microlens groups for allowing the subject light which passes through the picture-taking lens to be pupil-divided into light beams;

a second light receiving element group having a plurality of second light receiving elements each comprised of a pair of light receiving portions which receive the light beams of the subject light;

focus detection means for effecting focus detection based on outputs of the second light receiving element group;

correction means for correcting a subject image corresponding to a focus detection area present at the second light receiving element group on the basis of the outputs of the first light receiving element group; and image pick-up means for picking up an image based on signals output from the first light receiving element group and signals output from the correction means, wherein a color filter having a color array based on a predetermined rule is arranged in front of the first and second light receiving groups and the correction means corrects a pair of outputs of the second light receiving element group on the basis of an additively calculated signal.

10. An image pick-up apparatus according to claim 9, wherein the predetermined rule is based on a bayer array or a complementary color type color filter array.

11. An image pick-up apparatus on which a chip-like image pick-up device for electronically picking up a subject light passing through a picture-taking lens, comprising:

a first light receiving element group which is formed on the chip-like image pick-up device and comprises a plurality of first light receiving elements arranged to allow the subject light to be received;

a first microlens group which is placed on the chip-like image pick-up device and comprises a plurality of microlenses arranged to respectively oppose the first light receiving elements of the first light receiving element group for allowing the subject light which has passed through the picture-taking lens to converge on the first light receiving elements;

a second light receiving element group which is formed on the chip-like image pick-up device and comprises a plurality of second light receiving elements each comprising a pair of light receiving portions which receive the subject light which passes through the picture-taking lens;

a second microlens group which is placed on the chip-like image pick-up device and comprises a plurality of microlenses arranged to respectively oppose the second light receiving elements of the second light receiving element group for allowing the subject light which has passed through the picture-taking lens to be pupil-divided into light beams;

a focus detection section for effecting focus detection of the image pick-up apparatus based on outputs of the second light receiving element group;

a correction section for correcting output signals corresponding to a subject image and to a focus detection area present at the second light receiving element group on the basis of outputs of the first light receiving element group; and an image pick-up section for picking up the subject image based on signals output from the first light receiving element group and signals output from the correction section.

12. An image pick-up apparatus according to claim 11, wherein the correction section makes correction based on outputs of predetermined ones of the first light receiving elements situated at a peripheral area of the second light receiving element.

13. An image pick-up apparatus according to claim 11, wherein, in the focus detection area, the first light receiving elements and second light receiving elements are sequentially alternately arranged at a predetermined number interval unit.

14. An image pick-up apparatus according to claim 11, wherein, the microlens is arranged at one corresponding second light receiving element and at one corresponding first light receiving element to make a light sensitivity optimal.

15. An image pick-up apparatus according to claim 11, wherein a storage operation is effected by the second light receiving group arranged at the focus detection area and the image pick-up section picks up an image based on signals output from the first light receiving element group and signals output from the second light receiving element group.

16. An image pick-up apparatus according to claim 11, wherein the focus detection area comprises first and second areas and the second light receiving element group arranged at the first area effects focus detection of the subject having a horizontal contrast and the second light receiving element group arranged at the second area effects focus detection of the subject having a vertical contrast, and the focus detection section effects focus detection based on the outputs of the second light receiving elements at the first and second areas.

17. An image pick-up apparatus having an image pick-up device for electronically picking up a subject image passing through a picture-taking lens, comprising:

a first light receiving element group having a plurality of first receiving elements arranged to allow the subject image to be received;

a microlens group for allowing the subject light which passes through the picture-taking lens to be pupil-divided into light beams;

a second light receiving group having a plurality of second light receiving elements each comprised of a pair of light receiving portions which receive the light beams of the subject light;

a focus detection section for effecting focus detection of the image pick-up apparatus based on outputs of the second light receiving elements;

a correction section for correcting an image of the focus detection area present in the second light receiving element group on the basis of outputs of the first light receiving element group; and an image pick-up section for picking up an image based on signals output from the first light receiving element group and signal output from the correction section, wherein, in front of at least the first light receiving element group, a color filter is arranged as a color array based on a predetermined rule and the correction section corrects color information based on a predetermined rule at an area present in the second light receiving element group and does so based on the outputs of those elements of the first light receiving element group having the same color as that of the color information in the color filter.

18. An image pick-up apparatus according to claim 17, wherein the predetermined rule corresponds to a bayer array or a complementary color type color filter array.

19. An image pick-up apparatus having an image pick-up device for electronically picking up a subject image passing through a picture-taking lens, comprising:

a first light receiving element group having a plurality of first receiving elements arranged to allow the subject image to be received;

a microlens group for allowing the subject light which passes through the picture-taking lens to be pupil-divided into light beams;

a second light receiving group having a plurality of second light receiving elements each comprised of a pair of light receiving portions which receive the light beams of the subject light;

a focus detection section for effecting focus detection of the image pick-up apparatus based on outputs of the second light receiving elements;

a correction section for correcting an image of the focus detection area present in the second light receiving element group on the basis of outputs of the first light receiving element group; and an image pick-up section for picking up an image based on signals output from the first light receiving element group and signal output from the correction section, wherein a color filter having a color array based on a predetermined rule is arranged in front of the first and second light receiving element groups and the correction section corrects a pair of outputs of the second light receiving element group on the basis of additively calculated signal.

20. An image pick-up apparatus according to claim 19, wherein the predetermined rule is based on a bayer array or a complementary color type color filter array.

* * * * *